(12) United States Patent
Yeh et al.

(10) Patent No.: US 6,587,026 B2
(45) Date of Patent: Jul. 1, 2003

(54) EMBEDDED TRANSFORMER

(75) Inventors: Ming Yeh, Taoyuan Sien (TW); Heng Cheng Chou, Taoyuan Sien (TW); Chen-Feng Wu, Taoyuan Sien (TW); Hui-Hua Teng, Taoyuan Sien (TW); Chien-Chia Lin, Taoyuan Sien (TW)

(73) Assignee: Delta Electronics Inc., Taoyuan Sien (TW)

( * ) Notice: Subject to any disclaimer, the term of this patent is extended or adjusted under 35 U.S.C. 154(b) by 1 day.

(21) Appl. No.: 09/941,625

(22) Filed: Aug. 30, 2001

(65) Prior Publication Data

US 2002/0075120 A1 Jun. 20, 2002

(30) Foreign Application Priority Data

Dec. 20, 2000 (TW) ...................................... 89222059 U

(51) Int. Cl.[7] .................................................. H01F 5/00
(52) U.S. Cl. ........................ 336/223; 336/200; 336/232
(58) Field of Search ................................ 336/200, 223, 336/232

(56) References Cited

U.S. PATENT DOCUMENTS

| | | | | | |
|---|---|---|---|---|---|
| 5,319,342 | A | * | 6/1994 | Kuroki | 336/170 |
| 5,565,837 | A | * | 10/1996 | Godek et al. | 336/232 |
| 6,069,548 | A | * | 5/2000 | Baarman et al. | 336/65 |
| 6,181,232 | B1 | * | 1/2001 | Kitamura | 336/200 |

* cited by examiner

*Primary Examiner*—Anh Mai
(74) *Attorney, Agent, or Firm*—Intellectual Property Solutions, Incorporated

(57) ABSTRACT

An embedded transformer embedded in a board is disclosed. The embedded transformer includes a board, a first insulating sheet, a preformed coil, a second insulating sheet, a first core and a second core. Among these, the board includes a conductive pattern formed on an upper surface of the board. A part of said conductive pattern serves as a primary coil of the embedded transformer. The first insulating sheet is formed on the conductive pattern. The preformed coil is formed on the first insulating sheet. The second insulating sheet is formed on the preformed coil. The first core is formed on the second insulating sheet and partially embedded in the board. The second core formed on a lower surface of the board is partially embedded in the board so as to be couple to the first core.

4 Claims, 2 Drawing Sheets

EMBEDDED TRANSFORMER

BACKGROUND OF THE INVENTION

1. Field of the Invention

The present invention relates to a transformer, and more particularly to an embedded transformer.

2. Description of the Prior Art

A conventional transformer bobbin 10, as shown in FIG. 1, is composed of a bobbin 10 and cores 20, 30. The tubular body of the bobbin 10 is used to accommodate the central posts 25 of the cores 20, 30 and providing winding of wire formed thereon. The wire includes the wire of primary side (not shown) and the wire of secondary side 60, thereafter called wire 60 for short. A plurality of partition walls 50 are formed on the surface of the bobbin 10 so as to isolate the primary side, the secondary side and a plurality of winding grooves located on the secondary side. Each of the partition walls 50 further has a notch 51 formed thereon.

Still referring to FIG. 1, the secondary side of the bobbin 10 further has two pins, including a start terminal 70a and an ending terminal 70b. Among these, the start terminal 70a is used as a terminal from which winding of wire 60 is started and the ending terminal 70b is used as a terminal at which winding of wire 60 is terminated. During the wire 60 extends from the start terminal 70a to the ending terminal 70b, the wire 60 passes the winding groove so as to form windings. Once the winding number of a winding groove conforms to a predetermined value, the wire 60 extends to the next adjacent winding groove, through the above-mentioned notch 51, to form another winding. However, for the simplification of drawing, the present invention merely depicts the wire 60 adjacent to the start terminal 70a and the ending terminal 70b. Unfortunately, during the wire 60 passes the notch 51, the notch 51 is liable to scrape the insulating coating formed on the wire 60 and result in a short circuit.

In sum, the complex bobbin is required for the conventional transformer. Besides, during the wire passes the notch, the insulating coating formed on the wire may be scraped off and result in a short circuit. Accordingly, there has been a strong felt need for a novel transformer for solving the above-mention problems.

SUMMARY OF THE INVENTION

Therefore, the main object of the present invention is to provide a novel transformer can overcome aforementioned problems.

Another object of the present invention is to provide a novel transformer can fully take advantage of the resource of the user.

The advantages of the present invention are described as follows. Because the present transformer is embedded in the board, the present transformer has a lower profile compared to the conventional transformer. In the present invention, the required bobbin for the conventional trans former can be omitted. Since the bobbin is omitted, the present invention prevents the insulating coating coated on the wire from scraped off during the wire passes through the notch. Short-circuiting is thus avoided. The manufacturing cost is obviously reduced since the present transformer fully takes advantage of the resource of the user.

The above objects of the present invention are achieved by providing an embedded transformer embedded in a board. The embedded transformer includes a board, a first insulating sheet, a preformed coil, a second insulating sheet, a first core and a second core. Among these, the board includes a conductive pattern formed on an upper surface of the board. A part of the conductive pattern serves as a primary coil of the embedded transformer. The board does not only serve as the base of the conductive pattern, but also includes some electrical component and circuit formed on the remaining part. The designer of the board previously forms the conductive pattern. Besides, the conductive pattern can be formed based on the typical process for forming the trace on the printed circuit board.

The first insulating sheet is formed on the conductive pattern. The preformed coil is formed on the first insulating sheet and serves as a secondary coil of the embedded transformer. Besides, the interposed first insulating sheet electrically insulates the preformed coil form the conductive pattern. The preformed coil further includes a second insulating sheet formed thereon. The first core and the second core are formed on the second insulating sheet and the lower surface the board, respectively. Additionally, the first core and the second core are partially embedded in the board so as to be coupled to each other.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 2:
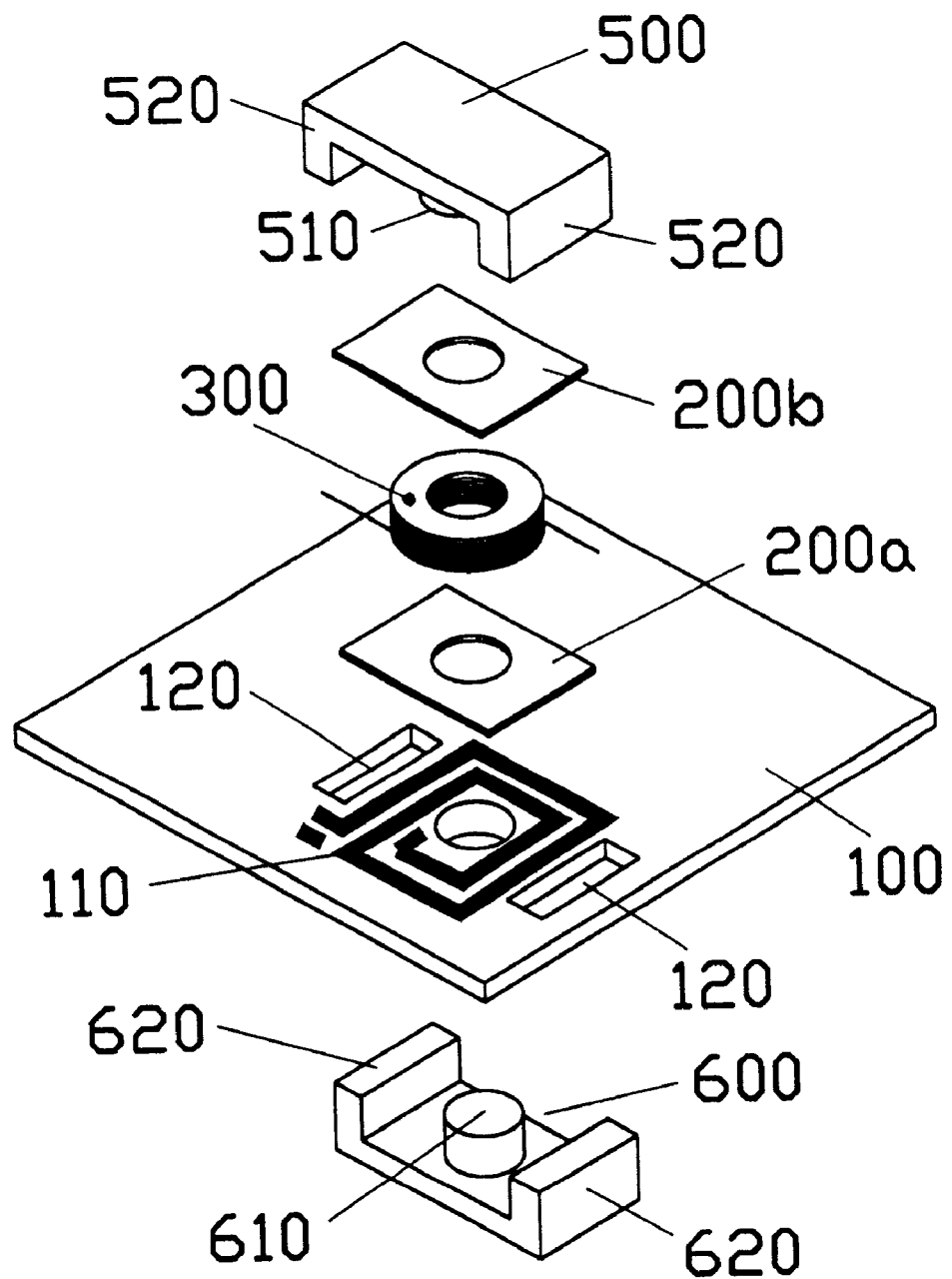
FIG. 2 is an exploded view illustrating the transformer according to the present invention.

An embedded transformer embedded in a board is disclosed. As shown in FIG. 2, the embedded transformer includes a board 100, a first insulating sheet 200a, a preformed coil 300, a second insulating sheet 200b, a first core 500 and a second core 600. Among these, the board 100 includes a conductive pattern 110 formed on an upper surface of the board 100. A part of said conductive pattern 110 serves as a primary coil of the embedded transformer. It should be noted that the board 100 does not only serve as the base of the conductive pattern 110, but the board 100 also includes some electrical component and circuit (not shown) formed on the remaining part. The designer of the board previously form the conductive pattern 110, the manufacturer does not need to form the conductive pattern 110 serving as the first coil. Thus, the present transformer fully takes advantage of the resource of the user. Besides, the conductive pattern 110 can be formed based on the typical process for forming the trace on the printed circuit board.

Still referring to FIG. 2, the first insulating sheet 200a is formed on the conductive pattern 110. The preformed coil 300 is formed on the first insulating sheet 200a and serves as a secondary coil of the embedded transformer. Besides, the interposed first insulating sheet 200a electrically insulates the preformed coil 300 form the conductive pattern 110. The preformed coil 300 further includes a second insulating sheet 200b formed thereon.

Still referring to FIG. 2, the first core 500 and the second core 600 are formed on the second insulating sheet 200b and the lower surface the board 100, respectively. Additionally, the first core 500 and the second core 600 are partially embedded in the board 100 so as to be coupled to each other. In detail, the board 100 further includes at least one opening 120. The first core 500 further includes a first central post 510 and a plurality of first side posts 520. The second core 600 further includes a second central post 610 and a plurality of second side posts 620. Among these, the opening 120 makes the first side posts 520 and the second side posts 620 be coupled to each other. Besides, the second central post 610 penetrates the second insulating sheet 200b, the preformed coil 300, the first insulating sheet 200a and the board 100 so as to be coupled to the first central post 510. That is, the first core 500 and the second core 600 are partially embedded in the board 100.

Figure 1:
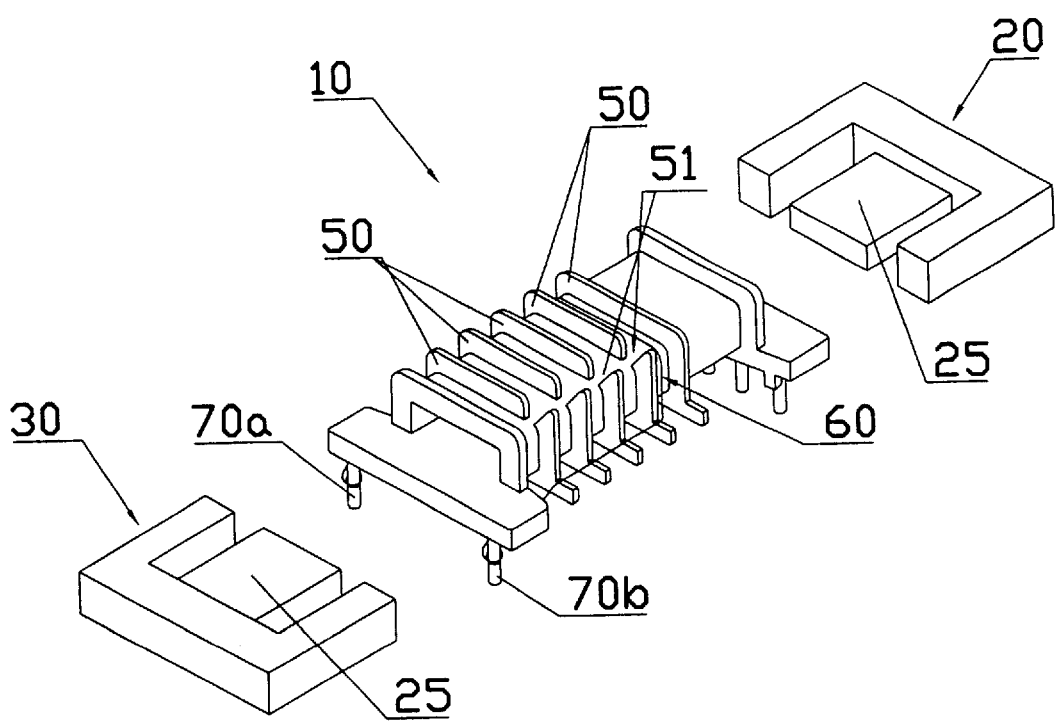
FIG. 1 depicts a conventional transformer.

Still referring to FIG. 2, according to the foregoing statement, the advantages of the present invention are described as follows. (1) Because the present transformer is embedded in the board, the present transformer has a lower profile compared to the conventional transformer. (2) In the present invention, the required bobbin for the conventional transformer can be omitted. (3) Since the bobbin is omitted, the present invention prevents the insulating coating coated on the wire from scraped off during the wire (e.g. the wire 60 shown in FIG. 1) passes through the notch (e.g. the notch 51 shown in FIG. 1). Short-circuiting is thus avoided. (4) The manufacturing cost is obviously reduced. The present transformer fully takes advantage of the resource of the user. Since the designer preserves the layout of the conductive pattern 110, the manufacturer does not need to form the first coil.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. An embedded transformer, comprising:
    a board, said board including a conductive pattern formed on an upper surface of said board, a part of said conductive pattern serving as a primary coil;
    a first insulating sheet, formed on said conductive pattern;
    a preformed coil, formed on said first insulating sheet, said preformed coil serving as a secondary coil;
    a second insulating sheet, formed on said preformed coil;
    a first core, formed on said second insulating sheet, a part of said first core embedded in said board; and
    a second core, formed on a lower surface of said board, a part of said second core embedded in said board to be couple to said first core.

2. The embedded transformer according to claim 1, wherein:
    said board further includes at least one opening;
    said first core further includes a first central post and a plurality of first side posts; and
    said second core further includes a second central post and a plurality of second side posts, said first central post being coupled to said second central post through said opening, said first side posts being coupled to said second side posts through said opening.

3. The embedded transformer according to claim 2, wherein said second central post penetrates said second insulating sheet, said preformed coil, said first insulating sheet and said board so as to be coupled to said first central post.

4. An embedded transformer, comprising:
    a board, said board including at least one opening and a conductive pattern formed on an upper surface of said board, a part of said conductive pattern serving as a primary coil;
    a first insulating sheet, formed on said conductive pattern;
    a preformed coil, formed on said first insulating sheet, said preformed coil serving as a secondary coil;
    a second insulating sheet, formed on said preformed coil;
    a first core, formed on said second insulating sheet, said first core including a first central post and a plurality of first side posts, said first central post and said first side posts embedded in said board
    a second core, formed on a lower surface of said board, said second core including a second central post and a plurality of second side posts, said second central post and said second side posts embedded in said board; and
    wherein said second central post penetrates said second insulating sheet, said preformed coil, said first insulating sheet and said board so as to be coupled to said first central post, said first side posts being coupled to said second side posts through said opening.

* * * * *